United States Patent [19]

Mueller et al.

[11] Patent Number: 4,927,736
[45] Date of Patent: May 22, 1990

[54] HYDROXY POLYIMIDES AND HIGH TEMPERATURE POSITIVE PHOTORESISTS THEREFROM

[75] Inventors: Werner H. Mueller, East Greenwich; Dinesh N. Khanna, West Warwick, both of R.I.

[73] Assignee: Hoechst Celanese Corporation, Summit, N.J.

[21] Appl. No.: 76,098

[22] Filed: Jul. 21, 1987

[51] Int. Cl.$^5$ .................. G03C 1/495; G03C 5/16
[52] U.S. Cl. .................. 430/275; 430/326; 430/176; 430/192; 430/197; 430/270; 528/353; 528/188; 528/172
[58] Field of Search .................. 528/353, 188, 172; 430/270, 326, 176, 192, 197, 275

[56] References Cited

U.S. PATENT DOCUMENTS

| | | | |
|---|---|---|---|
| 3,666,709 | 5/1972 | Suzuki et al. | 528/353 X |
| 3,692,740 | 9/1972 | Suzuki et al. | 528/353 X |
| 3,959,350 | 5/1976 | Rogers | 528/188 |
| 4,111,906 | 9/1978 | Jones et al. | 528/188 |
| 4,339,521 | 7/1982 | Ahne et al. | 430/192 |
| 4,657,832 | 4/1987 | Pfeifer | 430/270 X |
| 4,698,295 | 10/1987 | Pfeifer et al. | 430/270 X |

*Primary Examiner*—Richard L. Schilling
*Assistant Examiner*—Cynthia Hamilton
*Attorney, Agent, or Firm*—Perman & Green

[57] ABSTRACT

This invention relates to novel hydroxy polyimides and radiation sensitive compositions prepared therefrom. More particularly the invention relates to positive photoresists useful in the preparation of a thermally stable relief pattern on a substrate e.g. a silicon wafer or aluminum plate. The novel hydroxy polyimides of the invention may also be used to provide thermally stable organic protective films and layers e.g. an insulating and-/or a passivating layer in a semi-conductor component.

The novel hydroxy polyimides of in this invention can be synthesized by the condensation of a hydroxy-substituted aminophenol and a dianhydride. Radiation sensitive compositions prepared from the novel hydroxy polyimides of the invention can be developed in aqueous base developer or organic solvent developer; preferably aqueous base developer. Also, the base developer dissolution properties of the polyimides can be controlled by incorporating a non-hydroxyl diamine into the polyimide.

The polyimides utilized in this invention have good solubility properties in various organic solvents and also have good mechanical, electrical, adhesion and thermal properties. Radiation sensitive compositions made from hydroxy polyimides of this invention provide high-resolution relief images which are thermally stable up to a temperature of approximately 300° C.

36 Claims, No Drawings

HYDROXY POLYIMIDES AND HIGH TEMPERATURE POSITIVE PHOTORESISTS THEREFROM

BACKGROUND OF THE INVENTION

This invention relates to the synthesis of novel hydroxy polyimides and their application in making aqueous base developable positive resists for high temperature applications.

Positive resist compositions and their use are well known. Generally such resists compositions are prepared from alkali-soluble, phenol-formaldehyde novolak resins and light or radiation sensitive o-quinone diazides or naphthoquinone diazides. Examples of such positive resists are described in U.S. Pat. Nos. 3,666,473; 4,115,128; and 4,173,470.

Conventional positive novolak resists have limited temperature dimensional stability and are not well suited for modern high temperature processes and applications. Heat resistant, negative resists are known in the art and disclosed in U.S. Pat. Nos. 3,957,512; 4,045,223; 4,088,489; Re. 30,186 and DE 3411659A1. Also heat resistant, positive resists are known and disclosed in U.S. Pat. Nos. 4,093,461; 4,339,521; and 4,395,482. The advantages of positive resists over negative resists are also known in the art which include higher resolution and exposure time stability in the presence of oxygen.

In the industrial application of positive resists: the polymeric component and the radiation sensitizer are dissolved in an organic solvent or mixture of solvents and applied as a thin film or coating to a substrate suitable for the desired application.

The polymeric component of these resist formulations is desirably soluble in aqueous alkaline solutions, but the sensitizer acts as a dissolution rate inhibitor with respect to the polymer. Upon exposure of selected areas of the coated substrate to actinic radiation, the sensitizer undergoes a radiation induced structural transformation and the exposed areas of the coating are rendered more soluble than the unexposed areas. This difference in solubility rates causes the exposed areas of the resist coating to be dissolved when the substrate is immersed in developing solution leaving the unexposed areas substantially intact, thus producing a positive relief pattern on the substrate.

In most applications, the exposed and developed substrate will be subjected to treatment by a substrate-etchant solution. The resist coating protects the coated areas of the substrate from the etchant and thus the etchant is only able to etch the uncoated areas of the substrate, which in the case of a positive resist, corresponds to the areas that were exposed to actinic radiation. Thus, an etched pattern can be created on the substrate which corresponds to the pattern of the mask, stencil, template, etc., that was used to create selective exposure patterns on the coated substrate prior to development.

The relief pattern of resist on substrate produced by the method described above is useful for various applications including, for example, as an exposure mask or a pattern such as is employed in the manufacture of miniaturized integrated electronic components or the manufacture of a printing plate.

The properties of a resist composition which are important in commercial practice include the solubility of the resist in the application solvent, the photospeed of the resist, development contrast, environmentally acceptable developer solubility, resist resolution, resist adhesion, dimensional stability at elevated temperature and abrasion resistance.

Photospeed is important for a resist, particularly in applications where a number of exposures are needed, for example, in generating multiple patterns by a repeated process, or where light of reduced intensity is employed such as in projection exposure techniques where the light is passed through a series of lenses and mono-chromatic filters. Thus, high, controlled photospeed is particularly important for a resist composition employed in processes where a number of multiple exposures must be made to produce a mask or series of circuit patterns on a substrate. Control of the photospeed is extremely important in order to produce high resolution relief patterns in microcircuitry; e.g., a photospeed too high can result in narrowing the processing conditions.

Resist resolution refers to the capability of a resist system to reproduce the smallest equally spaced line pairs and intervening spaces of a mask which is utilized during exposure with a high degree of image edge acuity in the developed exposed spaces. In many industrial applications, particularly in the manufacture of miniaturized electronic components, a resist is required to provide a high degree of resolution for very small line and space widths (on the order of a micron or so).

The ability of a resist to reproduce very small dimensions, on the order of a micron or so, is extremely important in the production of large scale integrated circuits on silicon chips and similar components. Circuit density on such a chip can be increased, assuming photolithography techniques are utilized, by increasing the resolution capabilities of the resist.

Various attempts have been made in the prior art to produce high temperature positive resists possessing the above desired properties. For example, U.S. Pat. No. 4,093,461 discloses a heat resistant, positive resist composition comprising a quinone or naphthoquinone diazide and the polycondensation product of an aromatic dianhydride (pryomellitic anhydride) and an aromatic diamine (4,4'-diaminodiphenylether). The properties of the positive resist of the patent are discussed in U.S. Pat. No. 4,395,482 (column 1, lines 46–64). There it is pointed out that the positive resist composition of U.S. Pat. No. 4,093,461 has limited storage life, insufficient stability to alkaline etching solutions and relatively small differences in solubility between the exposed and unexposed portion of the resist.

To date, the use of imagable polyimide resist system has been limited by the lack of photospeed (slow photospeed), excessive volume contraction and by shelf life problems. The exceptional dielectric and high temperature resistance properties of polyimides made them particularly useful in the semiconductor industry. They can be used, for example, as dielectric layers, alpha particle barriers in memory devices, ion implantation masks and passivation layers. The goal of numerous development programs has been the development of a simple, reliable and cost effective radiation sensitive polyimide system that could be used with common photolithographic equipment and processes. This was the goal of by the work of R. Rubner et al of Siemens Co. (R. Rubner, H. Ahne, E Kuhn, G. Kolodziej; Phot. Sci. 4 Eng. 23(5), 303–309 (1979). H. Ahne, H. Kruger, E. Pammer and R. Rubner, "Polyimide Synthesis, Characterization and Application", K. L. Mittal, ed., Vol. 2, 905-918, Plenum Press (1984). The basic systems in these publications consist of polyamic acid polymer bearing photoreactive side groups. To date, however, materials based on this chemistry have been plagued by poor shelf life, extraordinarily low photospeed and excessive post-development/post-cure structure contraction. Although materials based on this chemistry have yielded high resolution structures, they required exposures of ten minutes or longer. Shelf life was also notoriously short, particularly in highly concentrated solutions required for thick film applications and contraction of original structures upon cure was as much as 60 percent.

The present invention provides the synthesis of the novel hydroxy polyimides, their application as radiation sensitive composition; e.g., an alkali soluble hydroxy polyimide and a quinone diazide type sensitizer. In addition the polyimides of the invention can be used to provide high temperature protective coating.

High temperature resistant relief patterns with excellent resolution and adhesion properties can be made from the radiation-sensitive compositions of the present invention.

SUMMARY OF THE INVENTION

This invention is that of novel hydroxy polyimides typically prepared by the solution condensation of hexafluoro-2,2-bis-((3-amino-4-hydroxyphenyl)propane with dianhydride such as 5,5'[2,2,2-trifluoro-1-(trifluoromethyl)ethylidene]bis-1,3-isobenzofurandione, benzophenone tetracarboxylic dianhydride (BTDA), and oxydiphthalic dianhydride (ODPA). A portion of the hexafluoro-2,2-bis-(3-amino-4-hydroxy-phenyl)propane may be replaced with another diamine comonomer optionally containing less hydroxy substituents in order to reduce the solubility of the polymer in alkaline aqueous resist developer and to increase the polymer's solubility in the application solvent. Alternatively, the developer solubility of the polyimide can be reduced or its solvent solubility increased by neutralizing the solubilizing effect of the hydroxy groups in the preformed polymer by converting them to a less developer soluble moiety; for example, by acylating a portion of the hydroxy groups in the preformed polymer. The use of non-hydroxy comonomers or post-polymerization neutralization of the hydroxy groups provides another method of controlling the resist's photospeed.

The invention also is that of a positive high temperature resist composition comprising the above described polyimide and o-quinone and/or o-naphthoquinone diazide photosensitizer or other such radiation sensitizer systems.

It has also been found that the solvent solubility and base developability of the polyimide can be controlled by the selection of the aminophenol and dianhydride.

A particularly preferred aminophenol useful for making hydroxy polyimide is hexafluoro-2,2-bis-(3-amino-4-hydroxyphenyl)propane and preferred dianhydrides include: 5,5'[2,2,2-trifluoro-1-(trifluoromethyl)ethylidene]bis-1,3-isobenzofurandione (6F-dianhydride), 3,3',4,4'-benzophenone teracarboxylic dianhydride (BTDA), oxydiphthalic dianhydride (ODPA).

This invention provides a method for making a positive resist composition of predetermined solvent solubility and photospeed. The photosensitivity of the resists of the invention can be controlled, for example, from about 10mJ/cm² to about 300. This result is achieved by controlling the polyimide component's composition.

Positive resists of the invention after coating and exposure in the conventional manner can be developed in alkaline aqueous resist developer to provide fine structured relief structures suitable for use in microelectronic and printing applications and the photospeed of the resist can be controlled to suit the particular application at hand. These resists have high thermal stability (250-350° C.), improved photospeed, improved solubility in the commonly used coating solvents and superior adhesion. The resists of this invention have superior shelf storage stability over existing resists based on polyamic acid precursors which have poor storage stability. The resist formulations of the present invention can be stored without gel formation for an extended period of time at room temperature without affecting the photospeed or viscosity of the formulations.

The polyimides of this invention are useful in producing high-heat resistance protective coatings in addition to their application as high-temperature resistance positive resists.

DESCRIPTION OF THE PREFERRED EMBODIMENTS

This invention is directed to soluble hydroxy-substituted polyimides formed by the condensation of at least one hydroxy-substituted aromatic diamine and at least one aromatic dianhydride. The hydroxy-substituted polyimides of the invention are characterized by a recurring unit of the following structure:

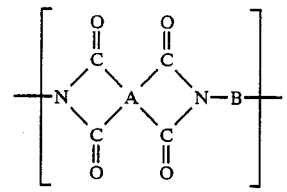

wherein the moiety A is a tetravalent aromatic radical containing at least one benzene nucleus or at least one naphthalene nucleus. In the moiety A, each pair of carbonyl groups are attached to adjacent carbons in a ring of the moiety A. The moiety B is a divalent aromatic group containing at least one hydroxy-substituted benzene nucleus. The moieties A and B may be unsubstituted or substituted with alkyl, alkoxy, aryl, aryloxy or other noninterferring substituents.

Preferably the tetravalent moiety A is selected from substituted and unsubstituted benzene nuceli, naphthalene nuceli, and polyphenyl nuclei having up to four phenyl rings and mixtures thereof; i.e.

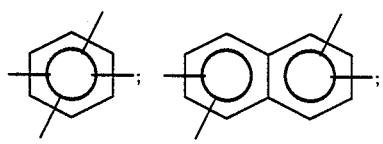

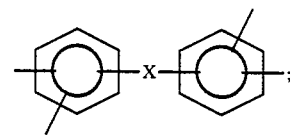

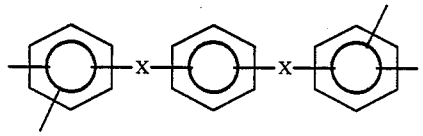

and

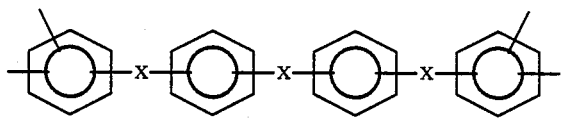

wherein X is a divalent radical independently selected from a covalent carbon to carbon bond;—O—(oxy)-;—CO—(carbonyl); —SO$_2$—(sulfonyl),—CH$_2$—(methylene);—(CH$_2$)$_{2-6}$ (polymethylene from 2 to 6 carbons);—CF$_2$—(perfluoromethylene);—(CF$_2$)$_{2-6}$ (polyperfluoromethylene having 2 to 6 carbons);—C(CH$_3$)$_2$—(isopropylidene); —C(CF$_3$)$_2$—(hexafluoroisopropylidene) and —CH$_3$CCF$_3$—(trifluoroisopropylidene).

Preferably the divalent, hydroxy-substituted moiety B is selected from benzene nuceli and polyphenyl nuceli containing up to six polyphenyl rings and mixtures thereof; i.e.

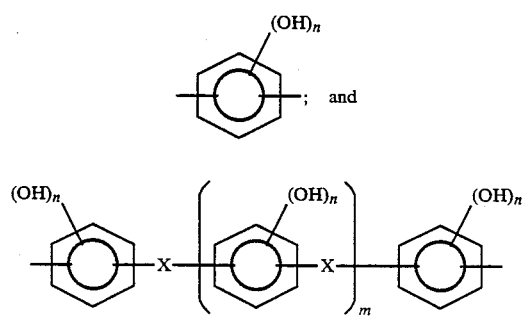

wherein X is a divalent radical as previously defined above; m is an integer from 0 to 4 and n is an integer independently selected from 0 to 3 with the proviso that the divalent moiety B contain at least one hydroxy substituent.

A portion of the aromatic, hydroxy-substituted nuclei B may be replaced with aromatic nuclei containing no hydroxy substituents to give a copolyimide of the following general structure:

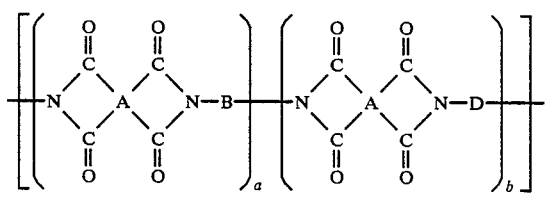

wherein A and B are as defined above and D is selected from aromatic divalent nuclei and mixtures thereof containing no hydroxy substituents. The terms a and b are equal to the mole fraction of each recurring unit in the polymer chain. The mole fractions a and b are:
a=0.2 to 1.0
b=0.0 to 0.8;
preferably
a=0.5 to 1.0
b=0.0 to 0.5, and
most preferably
a=0.7 to 1.0
b=0.0 to 0.3

In addition the copolyimides of the invention may be further modified by the addition of aliphatic and alicylic nuclei to the polyimide chain. The aliphatic and/or alicyclic component may be hydroxy substituted when present as the diamino component. The amount of aliphatic and alicylic nuclei should not exceed 50 mole percent of the copolyimide, preferably not in excess of 30 mole percent.

The moiety D is preferably a divalent radical having the formula:

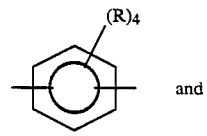

and

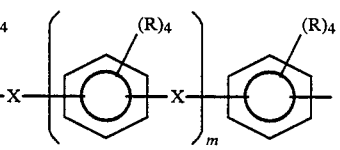

and mixtures thereof;
wherein m is an integer from 0 to 4; and R is independently selected from lower alkyl of 1 to 6 carbons, lower alkoxy of 1 to 6 carbons, carboxylic acyl having up to 10 carbons, halogen, hydrogen and wherein X is defined above.

The polyimides of the invention are prepared from at least one aromatic dianhydride having the formula:

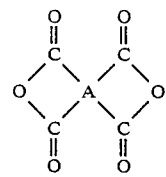

wherein A is as previously defined.

Illustrative of the aromatic dianhydrides for use in the present invention are pyromellitic dianhydride; 2,3,6,7-naphthalene tetracarboxylic dianhydride: 3,3'4,4'-diphenyl tetracarboxylic dianhydride; 1,2,5,6-naphthalene tetracarboxylic dianhydride; 2,2',3,3'-diphenyl tetracarboxylic dianhydride; 2,2-bis-(3,4-dicarboxyphenyl)propane dianhydride; 2,2-bis-(3,4-dicarboxyphenyl)-hexafluoropropane dianhydride, bis-(3,4-dicarboxyphenyl)sulfone dianhydride; 3,4,3,10-perylene tetracarboxylic acid dianhydride; bis(3,4-dicarboxyphenyl)ether dianhydride; 2,2-bis(2,3-dicarboxyphenyl)propane dianhydride; 1,1-bis(2,3-dicarboxyphenyl)ethane dianhydride; bis(3,4-dicarboxyphenyl)methane dianhydride; bis(2,3-dicarboxyphenyl)sulfone dianhydride; and benzophenone tetracarboxylic dianhydride. Their method of preparation are known, see for example U.S. Pat. Nos. 3,310,573; 3,408,411; 3,553,282 and 4,030,948 which are incorporated by reference into the instant disclosure.

The polyimides of the invention are prepared from at least one hydroxy-substituted aromatic diamine having the formula: NH$_2$—B—NH$_2$ wherein B is as previously defined. Illustrative hydroxy-substituted, aromatic diamine which may be employed in the practice of the present invention are: 3,3'-dihydroxy benzidine; 3,4'-diamino-3'4'-dihydroxybiphenyl; 3,3'-dihydroxy-4,4'-diamino diphenyloxide; 3,3'-dihydroxy-4,4'-diamino diphenylsulfone; 2,2-bis(3-amino-4-hydroxyphenyl)propane; bis(3-hydroxy-4-aminophenyl)methane; 2,4-diaminophenol; 3,3'-dihydroxy-4,4'-diamino benzophenone; 1,1-bis(3-hydroxy-4-aminophenyl)ethane; 1,3-bis(3-hydroxy-4-aminophenyl)propane; 2,2-bis-(3-hydroxy-4-aminophenyl)propane, hexafluoro-2,2-bis-(3-amino-4-hydroxyphenyl)propane having the formula:

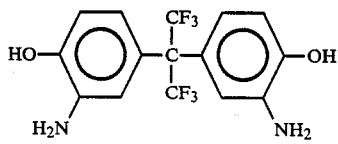

Their method of preparation is known; see e.g. J. Polymer Sci, Vol. 20, p. 2381–2391 (1982).

A portion of the hydroxy-substituted aromatic diamines may be replaced with a diamine of the formula: NH$_2$—D—NH$_2$ wherein D is as previously defined.

Illustrative of each aromatic diamine comonomers are m-phenylene diamine; p-phenylene diamine; 4,4'diaminodiphenyl ether; 3,3'-diaminodiphenyl ether; 3,4'-diaminodiphenyl ether; 1,3-bis-(aminophenoxy)-benzene (m-APB); 1,4-bis(aminophenoxy)benzene (p-APB); benzidine; 3,3'-dimethoxy benzidine; 3,3'-dimethyl benzidine; 3,3'-diethyl benzidine; 3,3'-diaminodiphenyl methane; 4,4'-diaminodiphenyl methane; 4,4'-diaminodiphenyl propane; 3,3'-diaminodiphenyl sulfone; 4,4'-diaminodiphenyl sulfone; 4,4'-diaminodiphenyl sulfide; hexafluoro2,2'-bis(4-aminophenyl)propane,α,α-bis(amino-phenyl)p-diisopropylbenzene; 1,3-bis[4(4-aminophenoxy)- α, α-bistrifluoromethyl]benzene; 2,2-bis[4-(4-aminophenoxy)-phenyl]hexafluoropropane; hexafluoro-2,2-bis-(3-amino-4-methylhexafluoro-2,2-bis-(4-aminophenyl)propane: hexafluoro-2,2-bis-(3-aminophenyl)propane; m-xylylenediamine; p-xylylenediamine; 4,4'-bis(p-aminophenoxy)diphenyl sulfide; 4,4'-bis (3''-aminophenoxy)-diphenyl sulfide; 4,4'(3''-aminophenoxy-(4'- aminophenoxy)-diphenyl sulfide; 4,4'-bis(p-aminophenoxy)-diphenyl sulfone; 4,4'-bis-(3''-aminophenyl sulfone; 2,2-bis-[4'-p-aminophenoxy)phenyl]propane; 2,2-bis-[3'p-aminophenoxy)phenyl]propane; 1,1-bis-[4'(p-aminophenoxy)phenyl]ethylbenzene and mixtures thereof.

Illustrative of the aliphatic and alicyclic diamines useful in preparing copolyimides are: 1,2-bis(3-aminopropoxy)ethane; bis(4-aminocyclohexyl)methane; hexamethylene diamine, octamethylene diamine; 1,4-cyclohexane diamine; decamethylene diamine; dodecamethylene diamine, bis(3-aminopropyl)sulfide; 3-hydroxy-hexamethylene diamine, 1,3-diamino-2-hydroxypropane, 2,6-diamino-1-hydroxycyclohexane.

Illustrative of aliphatic and alicyclic dianhydrides useful in preparing copolyimides of the invention are: ethylene tetracarboxylic dianhydride, 1,2,3,4-butane tetracarboxylic dianhydride, 1,2,3,4-cyclopentane tetracarboxylic dianhydride, and 2,3,5,6-cyclohexane tetracarboxylic dianhydride.

Preferred polyimides are those containing hexafluoro-2,2-bis-(3-amino-4-hydroxyphenyl)propane and 2,2-bis-(3,4-dicarboxylphenyl)-hexafluoropropane dianhydride. Illustrative of these polyimides are those prepared hexafluoro-2,2-bis-(3-amino-4-hydroxyphenyl)-propane and a dianhydride selected from 5,5'-oxy-bis-1-3-isobenzofurandione; 3,3',4,4'-benzophenone tetracarboxylic dianhydride and 2,2-bis-(3,4-dicarboxyphenyl)-hexafluoropropane dianhydride. Preferred diamine comonomers include hexafluoro-2,2-bis-(3-aminophenyl)-propane and hexafluoro-2,2-bis-(4-aminophenyl)propane. The diamine and dianhydride monomers may be used in mixture to produce copolyimide having superior properties. Particularly preferred polyimides are those containing at least 50mole percent of the hexafluoro-2,2-bis-(3-amino-4-hydroxyphenyl)propane reactant; more preferably at least 30 mole percent.

Alternately, the polyimide can be modified after polymerization for example, by acylating a portion of the hydroxyl groups in the preformed polymer with a carboxylic aliphatic or aromatic acylating agent having up to 10 carbons such as acetic anhydride, propanoic anhydride, benzoyl chloride, and diketene.

The polyimides of this invention are prepared by known polymerization techniques, typically by the high-temperature solution condensation method using aminophenol and dianhydride employing paratoluene sulfonic acid as catalyst. See, for example, "Improved poly(amide-amide acids), polyimide acid, poly(esteramide acids), poly(amide-imides), polyimides, polyesterimides" by Berger, A. and Vora, Rohitkumar H., Eur. Patent Application 0163 518 (1985), which is incorporated herein by reference.

The polyimides of the present invention are useful in the preparation of positive photoresist compositions. These resist compositions comprise a polyimide as heretofore described and a radiation or light sensitizer. The polyimide and sensitizer are dissolved in a suitable solvent and applied to the desired substrate. The procedures for the preparation of resist are well known.

Similarly, the use of radiation sensitizer such as o-quinone diazides is well known to the skilled artisan as demonstrated by *Light Sensitive Systems*, Kosar, J.: John Wiley & Sons, New York, 1965 in Chapter 7.4 which is also incorporated herein by reference. Radiation sensitizers which comprise a component of the resist compositions of the present invention may be selected from the group of substituted naphthoquinone diazide sensitizers which are conventionally used in the art in positive resist formulations. Such sensitizing compounds are disclosed, for example, in U.S. Pat. Nos. 2,797,213; 3,106,465; 3,148,983; 3,130,047; 3,201,329; 3,785,825; and 3,802,885. Useful photosensitizers include naphthoquinone-(1,2)-diazide-5-sulfonyl chloride, and napththoquinone-(1,2)-diazide-4-sulfonyl chloride condensed with phenolic compounds such as hydroxy benzophenones.

In general, any radiation sensitive compound or composition may be used with the hydroxy polyimides of the invention provided that: (1) the compound or composition has a developer solubility inhibiting effect on the polyimide and (2) the compound or composition upon exposure to actinic radiation is directly or indirectly converted into smaller molecules which results in increased solubility, tackiness or volatility in the exposed area. Examples of such radiation sensitive compounds or compositions are disclosed in U.S. Pat. No.

4,247,611 and 4,619,998; the teachings of which are hereby incorporated by reference.

Radiation sensitizers such as those disclosed in the above-referenced patents comprise a radiation sensitive compound or mixture of such compounds which upon exposure to radiation generate an acid and a second compound or mixture of compounds containing at least one acid cleavable group.

Examples of such acid cleavable compounds are:
A. Compounds containing at least one orthocarboxylic acid ester group and/or carboxylic acid amideacetal group, whereby the compounds may also have a polymeric character and the above-mentioned groups may be present as connecting members in the main chain or as side groups.
B. Polymeric compounds with recurrent acetal and/or ketal groups in which preferably both -carbon atoms of the alcohols required for forming the groups are aliphatic.

Acid-cleavable compounds of the first type (A) are described in detail as components of radiation-sensitive compositions in U.S. Pat. No. 4,101,323 and 4,247,611 and compositions containing compounds of the second type (B) are the subject of U.S. Pat. No. 4,189,323, the teachings of which are incorporated by reference.

Suitable acid-cleavable compounds also include, for example, the particular aryl-alkyl-acetals and aminals disclosed in German Pat No. 23 06 248, which decompose in the presence of acid photolysis products. Other compounds of this type are enolic ethers and acyliminocarbonates, as disclosed by European Applications No. 6,626 and No. 6,627.

A large number of known compounds and mixtures, such as diazonium salts, phosphonium salts, sulfonium salts and iodonium salts or halogen compounds, quinone diazide sulfochlorides and organometal/organohalogen combinations, may be used as radiation-sensitive constituents forming or splitting-off acids during irradiation. Suitable diazonium salts are the compounds with a useful absorption range between 300 and 600 nm. Generally this diazonium, phosphonium, sulfonium and iodonium compounds are used in the form of salts soluble in organic solvents, normally as the separation products with complex acids, such as hydrofluoboric acid, hexafluophosphoric acid, hexafluoantimonic acid or hexafloarsenic acid. Alternatively, derivatives of positive-working o-quinone diazides may be used. From this group of compounds, the naphthoquinone-1,2-diazide-4-sulfochloride is preferred, because, during its exposure, three acid functions are formed which give rise to a relatively high degree of intensification during splitting of the polyacetals and polyketals.

In principle, all organic halogen compounds known as free radical-forming photoinitiators, for example, those containing more than one halogen atom attached to a carbon atom or an aromatic ring, may be used as halogen-containing radiation-sensitive compounds capable of forming a hydrohalic acid. Examples of such compounds are disclosed in U.S. Pat. Nos. 3,515,552; 3,536,489; and 3,779,778; and 3,395,475. In addition, certain substituted trichloromethylpyrones, such as those described in U.S. Pat. No. 4,101,323 and the new 2-aryl-4,6-bis-trichloro-methyl-s-triazines disclosed in U.S. Pat. No. 4,189,323 may be used as acid generating components.

Specific examples of suitable acid generating compounds include are:

4-(di-n-propyl-amino)-benzene-diazonium-tetrafluoroborate, 4-p-tolylmercapto-2,5-diethoxy-benzene-diazonium-hexafluophosphate, 4-p-tolylmercapto-2,5-diethoxy-benzene-diazonium-tetrafluoborate, diphenylamine-4-diazonium sulfate, 4-methyl-6-trichloromethyl-2-pyrone, 4-(3,4,5-trimethoxy-styryl)-6-trichloromethyl-2-pyrone, 4-(4-methoxy-styryl)-6-3,3,3-trichloropropenyl)-2-pyrone, 2-trichloromethyl-benzimidazole, 2-tribromomethyl-quinoline, 2,4-dimethyl-l-tribromoacetylbenzene, 3-nitro-I-tribromo-acetyl-benzene, 4-dibromoacetylbenzoic acid, 1,4-bis-dibromomethyl-benzene, tris-dibromomethyl-s-triazine; 2-(6-methoxy-naphth-2-yl)-, 2-(naphth)-1-yl)-, 2-(naphth)-2-yl)-, 2-(4-ethoxyethyl-naphth-1-yl)-, 2-benzopyran-3-yl)-, 2-(4-methoxy-anthrac-1-yl)-, and 2-(phenanther-9-yl)-4,6-bis-trichloromethyl-s-triazine.

Additives such as colorants, dyes, anti-striation agents, plasticizers, adhesion promoters, speed enhancers, solvents and such surfactants as non-ionic surfactants may be added to the solution of polyimide, sensitizer and solvent before the solution is coated onto a substrate.

Examples of dye additives that may be used together with the photoresist compositions of the present invention include Methyl Violet 2B (C.I. No. 42535), Crystal Violet (C.I. 42555), Malachite Green (C.I. No. 42000), Victoria Blue B (C.I. 44045) and Neutral Red (C.I. No. 50040) at one to ten percent weight based on the combined weight of polyimide and sensitizer. The dye additives help provide increased resolution by inhibiting back scattering of light off the substrate.

Anti-striation agents may be used up to five percent weight level, based on the combined weight of polyimide and sensitizer.

Adhesion promoters which may be used include, for example, beta-(3,4-epoxy-cyclohexyl)-ethyltrimethoxysilane; p-methyldisilane-methyl methacrylate; vinyltrichlorosilane; and y-amino-propyl triethoxysilane up to a 4 percent weight level, based on the combined weight of polyimide and sensitizer.

Speed enhancers that may be used include, for example, picric acid, nicotinic acid or nitrocinnamic acid at a weight level of up to 2percent, based on the combined weight of polyimide and sensitizer. These enhancers tend to increase the solubility of the resist coating in both the exposed and unexposed areas, and thus they are used in applications when speed of development is the overriding consideration even though some degree of contrast may be sacrificed; i.e., while the exposed areas of the resist coating will be dissolved more quickly by the developer, the speed enhancers will also cause a larger loss of resist coating from the unexposed areas.

Typical commercial solvents employed in the art may be used preparing the resist compositions of this invention. The amount of solvent used in the preparation of the resist solution may range up to about 95% by weight of the solution. The polyimides of the prior art have limited solubility in N-methylpyrrolidone and dimethylacetamide whereas the polyimides of the present invention have enhanced solubility in those solvents and additional solvents acceptable for commercial use. Typical useful solvents are N-methylpyrrolidone, dimethylacetamide, propylene glycol methyl ether, methylethyl ketone, cyclohexanone, butyrolactone and mixtures thereof; preferred solvents are N-methylpyrrolidone and propylene glycol methyl ether.

The prepared resist solution, can be applied to a substrate by any conventional method used in the resist art, including dipping, spraying, whirling and spin coating. When spin coating, for example, the resist solution can be adjusted as to the percentage of solids content in order to provide coating of the desired thickness given the type of spinning equipment utilized and the amount of time allowed for the spinning process. Suitable substrates include silicon, aluminum or polymeric resins, silicon dioxide, doped silicon dioxide, silicon nitride, tantalum, copper, polysilicon, ceramics and aluminum/copper mixtures.

The resist coatings produced by the above described procedure ar particularly suitable for application to thermally grown silicon/silicon dioxide-coated wafers such as are utilized in the production of microprocessors and other miniaturized integrated circuit components. An aluminum/aluminum oxide substrate can be used as well. The substrate may also comprise various polymeric resins especially transparent polymers such as polyesters.

Preferred developing solutions for the radiation sensitive composition of the present invention are aqueous solutions of inorganic alkaline compounds such as those of sodium silicate, potassium silicate, sodium hydroxide, potassium hydroxide, lithium hydroxide, sodium phosphate, sodium monohydrogen phosphate, ammonium phosphate, ammonium monohydrogen phosphate, sodium metasilicate, sodium bicarbonate, ammonia, etc., with a suitable concentration of these compounds being between about 0.1 about 10, more preferably between 0.5 and 5%, by weight. Specific examples of developer solutions are disclosed in U.S. Pat. Nos. 3,110,596; 3,173,788; 3,586,504; etc.

Such an alkaline solution can also contain certain organic solvents such as alcohols (e.g., methanol, ethanol, benzyl alcohol, etc.) as well as a surface active agent (e.g., sodium alkylnaphthalene sulfonate, sodium lauryl sulfate, etc.) depending on the requirements.

After the resist composition solution is coated onto the substrate, the substrate is baked at approximately 80° to 105° C., preferably at about 90° C. until substantially all the solvent has evaporated and only a thin coating of photoresist composition on the order of a micron in thickness remains on the substrate. The coated substrate can then be exposed to actinic radiation in any desired exposure pattern, produced by use of suitable masks, negatives, stencils, templates, etc.

The exposed resist-coated substrates are next substantially immersed in developing solution. The solution is preferably agitated, for example, by nitrogen burst agitation.

The substrates are allowed to remain in the developer until all, or substantially all, of the resist coating has dissolved from the exposed areas.

After removal of the coated wafers from the developing solution, a post-development heat treatment or bake may be employed to increase the coating's adhesion and chemical resistance to etching solutions and other substances. In fact, the resist formulations of the present invention has excellent adhesion to substrates such as silicon wafers, aluminum plates, glass, polyester films etc. No adhesion promoter was necessary for the resist processing.

After curing the developed substrate may be treated with a buffered hydrofluoric acid or alkaline etching solution. The resist composition of the invention are resistant to both acid and base etching solutions and provide effective protection for the unexposed - resist-coated areas of the substrate. The developed, cured photoresist provides relief structures of excellent resolution and high thermal stability.

Although the above description is in terms of a wet-etching process, the relief patterns of the invention may be used in both wet and dry etching processes. The resulting structures are particularly useful insulating layers in microcircuitry applications, as masks in vapor depositions processes, ion implantation processes etc. Similarly, the resists of this invention may be used in the preparation of printing plates, lithographic proofing applications, lithographic transfer foils and other similar applications. The preparation of printing plates using positive resists is well known in the art; see e.g. U.S. Pat. No. 3,493,371; the teachings of which are incorporated by reference. They may be used as general protective coatings in numerous other applications readily apparent to one skilled in the art; e.g. the high solubility of the polyimides of the present invention make them particularly suited for high temperature protective coatings per se as well as in resist applications. In a typical coating application, a coating composition comprising about 5-30 weight percent of the polyimide of the invention in solution is applied to a substrate. Antioxidants, U V. stabilizers, adhesion promoters, colorants, flame retardants, fillers and other auxillary agents up to about 20 weight percent may be optionally employed in the coating composition. The solvent is removed at a suitable temperature generally about 90°-150° C. and a reduced pressure may be employed to facilitate the solvent removal. After removal of the solvent, the polyimide coated substrate may be further is heat treated to anneal the coating.

The following specific examples will provide detailed illustrations of the methods of producing and utilizing compositions of the present invention. These examples are not intended. however; to limit or restrict the scope of the invention in any way and should be construed as providing conditions, parameters of values which must be utilized exclusively in order to practice the present invention. In the following examples the term Dark Film Erosion Rate is abbreviated to Erosion Rate.

EXAMPLE 1

This example illustrates the preparation of hydroxy polyimide having the following recurring structure:

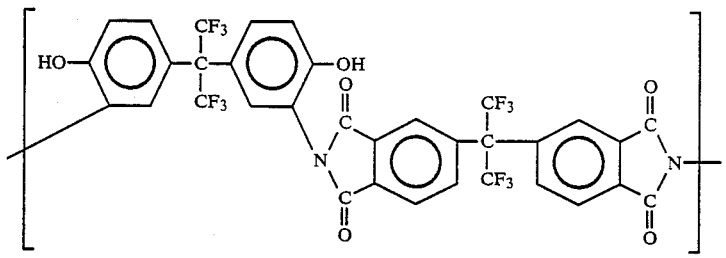

In a four necked 500 ml flask equipped with a thermometer, a condenser, a dean-stark trap, mechanical stirrer and a nitrogen inlet tube, 7.32 gm (0.02 moles) of hexafluoro-2,2-bis(3-amino-4-hydroxyphenyl)propane (6F-aminophenol) was char9ed under a nitrogen atmosphere along with 128 ml. monochlorobenzene (MCB) (80%), and 32.0ml of N-methylpyrrolidone (NMp) (20%). The mixture was stirred until a clear solution was obtained and 8.88 gm (0.02) mole) of 5,5'-[2,2,2-trifluoro-1-(trifluoromethyl) ethylidene]bis-1,3-isobenzofurandione (2,2-bis-(3,4-dicarboxyphenyl-hexafluoropropane dianhydride) was added. The contents of the flask were heated to 90° C. and 0.04 gm. para-toluene sulfonic acid (PTSA) was added. The contents were then heated at reflux temperature (about 142° C.). In first hour about 100 ml of the water-chlorobenzene azeotrope was separated in the dean-stark trap. Fresh 100 ml chlorobenzene added to the flask and the contents were refluxed for 10 hours at 142-145° C.

100 ml of NMP was then added and the mono-chlorobenzene was distilled off at 160°-165° C. The reaction mixture was cooled and slowly precipitated in an ice-water-methanol mixture. A white precipitate resulted which was washed thoroughly with hot water and the polymer was dried overnight in vacuum oven at 125° C.

The polymer had inherent viscosity of 0.50 dl/g in dimethylacetamide at 25° C. and was soluble in common organic solvents such as N-methylpyrrolidone, dimethylacetamide, tetrahydrofuran, diethylene glycol methyl ether, propylene glycol methyl ether (PCME) and methyl cellosolve. The glass transition temperature (Tg) of the polymer as determined by differential scanning calorimetry was 306° C.

EXAMPLE 2

This example illustrates the preparation of hydroxy polyimide having the following recurring structure:

In a four necked 500ml flask equipped with a thermometer, a condenser, a dean-stark trap, mechanical stirrer and a nitrogen inlet tube, 7.32 gm (.02 moles) of hexafluoro-2,2-bis(3-amino-4-hydroxyphenyl)propane (6F-aminophenol) was charged under a nitrogen atmosphere along with 128 ml. monochlorobenzene (MCB) (80%), and 32.0 ml of N-methylpyrrolidone (NMP) (20%). The mixture was stirred until a clear solution was obtained and 6.2 gm (0.02 mole) of 5,5'-oxy-bis-1,3-isobenzofurandionene (4,4'oxydiphthalic anhydride, ODPA) was added. The contents of the flask were heated to 90° C. and 0.04 gm. of para-toluene sulfonic acid (PTSA) was added. The contents were heated at reflux temperature (about 142° C.). In the first hour, about 100 ml of the water-chlorobenzene azeotrope was separated by dean-stark trap. Fresh 100 ml chlorobenzene was added to the flask and the contents were refluxed for 10 hours at 142-145° C.

100 ml of NMP was then added to the flask. Excess monochlorobenzene was distilled off at 16-165° C. The reaction mixture was cooled and slowly precipitated in an ice-water-methanol mixture. A white precipitate resulted which was washed thoroughly with hot water and the polymer was dried overnight at 125° C. in a vacuum oven.

The polymer had inherent viscosity of 0.50 dl/g in dimethylacetamide at 25° C. and was solubility in common organic solvents such as N-methylpyrrolidone, dimethylacetamide, tetrahydrofuran, diethylene glycol methyl ether, propylene glycol methyl ether (PCME) and methyl cellosolve. The glass transition temperature of the polymer as determined by DSC was 251° C.

EXAMPLE 3

This example illustrates the preparation of hydroxy polyimide having the following recurrinq structure:

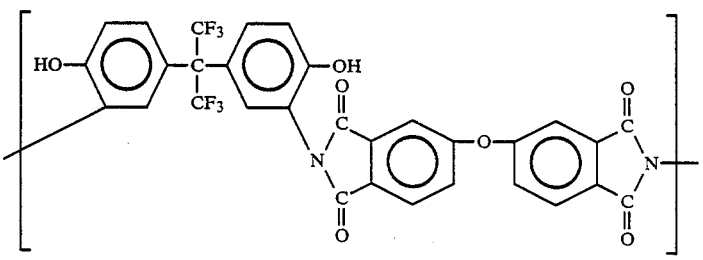

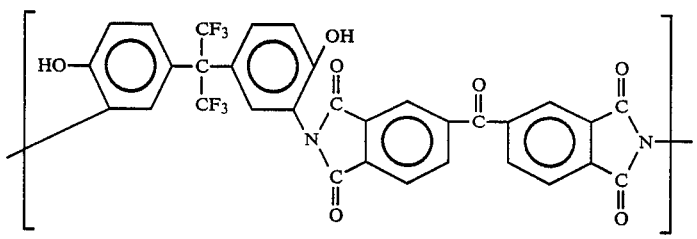

In a four necked, 500 ml flask equipped with a thermometer, a condenser, a dean-stark trap, mechanical stirrer and a nitrogen inlet tube, 7.32 gm (0.02 moles) of hexafluoro-2,2-bis(3-amino-4-hydroxyphenyl)propane (6F-aminophenol) was charged under a nitrogen atmosphere along with 128 ml monochlorobenzene (MCB) (80%), and 32 ml of N-methyl pyrrolidone (NMP) (20%). The mixture was stirred until a clear solution was obtained and 6.48 gm (.02 mole) of 3,3',4,4'-benzophenone tetracarboxylic dianhydride (BTDA) was added. The contents of the flask were heated to 90° C. and 0.04 gm. para-toluene sulfonic acid (PTSA) was added. The contents were heated at reflux temperature (about 142° C.). In the first hour about 100 ml of the water-chlorobenzene azeotrope was separated by the dean-stark trap. Fresh 100 ml chlorobenzene was charged into the flask and the contents were refluxed for 10 hours at 142-145° C.

100 ml of NMP was then added into the flask. Excess monochlorobenzene was distilled off at 160-165° C. and the reaction mixture was then cooled and slowly precipitated in an ice-water-methanol mixture. A white precipitate resulted which was washed thoroughly with hot water and the polymer was dried at 125° C. overnight in a vacuum oven.

The polymer has inherent viscosity of 0.51 dl/g in dimethylacetamide at 25° C. and was soluble in common organic solvents such as N-methylpyrrolidone, dimethylacetamide, tetrahydrofuran, diethylene glycol methyl ether, propylene glycol methyl ether (PGME) and methyl cellosolve.

EXAMPLE 4

This example illustrates the preparation of copolyimdes having the following recurring structure:

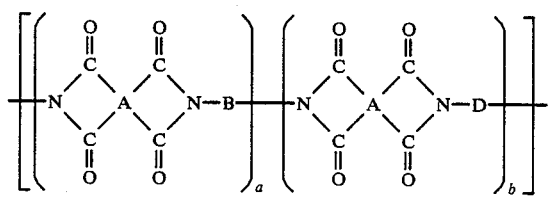

wherein:

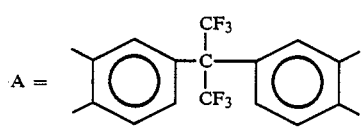

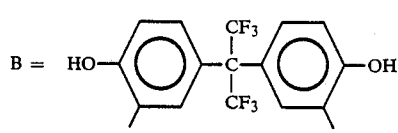

-continued

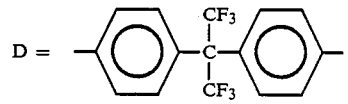

a = 0.8 mole fraction
b = 0.2 mole fraction

In a four necked 500 ml flask equipped with a thermometer, a condenser, a dean-stark trap, mechanical stirrer and a nitrogen inlet tube, 5.856 gm (0.016 moles) of hexafluoro-2,2-bis-(3-amino-4-hydroxyphenyl)propane (6F-aminophenol) and 1.336 gm (0.004 moles) of hexafluoro-2,2'-bis-(4-aminophenyl)propane were charged under a nitrogen atmosphere along with 128 ml monochlorobenzene (MCB) (80%), and 32 ml of N-methyl pyrrolidone (NMP) (20%). The mixture was stirred until a clear solution was obtained and 8.88 gm (0.01 mole) of 5,5'-[2,2,2-trifluoro-1(trifluoromethyl)ethylidene]bis-1,3-isobenzofurandione was then added. The contents of the flask were heated to 90° C. and 0.04 gm. para-toluene sulfonic acid (PTSA) was added. The contents were heated at reflux temperature (about 142° C.) In the first hour about 100 ml of water-chlorobenzene azeotrope was separated by dean-stark trap. Fresh 100 ml chlorobenzene was charged into the flask the contents were refluxed for 10 hours at 142°-145° C.

100 ml of NMP was then added to the flask and excess monochlorobenzene was distilled off at 160-165° C. The reaction mixture was cooled and slowly added to an ice-water-methanol mixture. A white precipitate resulted which was washed thoroughly with hot water and the polymer was dried overnight at 125° C. in a vacuum oven.

The polymer has inherent viscosity=0.65 dl/g in dimethylacetamide at 25° C. and has solubility in common organic solvents such as N-methylpyrrolidone, dimethylacetamide, tetrahydrofuran, diethylene glycol methyl ether, propylene glycol methyl ether (PGME) and methyl cellosolve.

EXAMPLE 5

A photoresist solution was prepared by dissolving 10 parts of hydroxy polyimide of Example 1 and 0.5 parts by weight of photosensitizer (mixed tris ester of trihydroxybenzophenone) and 0.08 parts by weight of red dye in 10 parts by weight of n-metharts by weight of propylene glycol methyl ether. The solution was filtered and then roller coated on an anodized aluminum plate. After drying for 30 minutes at 90° C., a resist film having thickness 2-3 um was obtained. This film was covered with a photomask having a stripped pattern so that the film and the photomask were in tight contact. Then UV light was irradiated thereon for 60 seconds by the use of mercury vapor lamp of 200 W. The intensity of the UV light at the film surface was 5 mw/cm$^2$ at a wavelength of 365 nm. After the irradiation, the coating was developed using 1:4 alkaline developer (AZ Developer):water mixture. The developed plate was washed with water to obtain a fine, uniform relief pattern having a minimum line width of 2μm.

EXAMPLE 6

A photoresist solution was prepared by dissolving 1.0 parts of hydroxy polyimide of Example 2 and 0.5 parts by weight of photosensitizer (mixed tris ester of trihydroxybenzophenone) and 0.08 parts by weight of red dye (disperse red 179) in 10 parts by weight of n-methylpyrrolidene and 10.0 parts by weight of propylene glycol methyl ether. The formulation was then filtered and then roller coated on an anodized aluminum plate. The coated plate was dried at 90° C. for 30 minutes at 90° C. to obtain a resist film having thickness 2-3 um. The film was then covered with a photomask having a stripped pattern so that the film and the photomask were in tight contact. Then UV light was irradiated thereon for 60 seconds using of mercury vapor lamp of 200 W. The intensity of the UV light at the film surface was 5 mw/cm$^2$ at a wavelength of 365 nm. After the photoresist was developed using 1:4 AZ alkaline developer (AZ Developer):water solution and rinsed with water to obtain a relief pattern having a minimum line width of 2 um.

EXAMPLE 7

A photoresist solution was prepared by dissolving 10 parts of hydroxy polyimide of Example 3 and 0.5 parts by weight of photosensitizer (mixed tris ester of trihydroxybenzophenone) and 0.08 parts by weight of red dye in 10 parts by weight of n-methylpyrrolidene and 10.0 parts by weight of propylene glycol methyl ether. The solution was filtered and then roller coated on an anodized aluminum plate. After drying for 30 minutes at 90° C., a resist film having thickness 2-3 um was obtained. This film was covered with a photomask having a stripped pattern so that the film and the photomask were in tight contact. Then UV light was irradiated thereon for 60 seconds by the use of mercury vapor lamp of 200 W. The intensity of the UV light at the film surface was 5 mw/cm$^2$ at a wavelength of 365 nm. After the irradiation, the coating was developed using 1:4 alkaline developer (AZ Developer):water mixture. The developed plate was washed with water to obtain a fine, uniform relief pattern having a minimum line width of 2 um.

EXAMPLE 8

A photoresist solution was prepared by dissolving 10 parts of hydroxy copolyimide of Example 4 and 0.5 parts by weight of photosensitizer (mixed tris ester of trihydroxybenzophenone) and 0.08 parts by weight of red dye in 10 parts by weight of n-methylpyrrolidene and 10.0 parts by weight of propylene glycol methyl ether. The solution was filtered and then roller coated on an anodized aluminum plate. After drying for 30 minutes at 90° C., a resist film having thickness 2-3 um was obtained. This film was covered with a photomask having a stripped pattern so that the film and the photomask were in tight contact. Then UV light was irradiated thereon for 60 seconds by the use of mercury vapor lamp of 200 W. The intensity of the UV light at the film surface was 5 mw/cm$^2$ at a wavelength of 365 nm. After the irradiation, the coating was developed using 1:1 alkaline developer (AZ Developer):water mixture. The developed plate was washed with water to obtain a fine, uniform relief pattern having a minimum line width of 2 um.

The following comparative examples were prepared in order to illustrate the improved positive photoresist compositions obtained using the hydroxy polyimide of this invention over those of photoresists based on polyimide acid precursors.

Photoresist compositions were prepared using the polyimides of the present invention prepared substantially in accordance with Examples 1-4 of the present invention.

The photosensitivity (speed) of each resist composition was evaluated using the following general procedure. Bake time, spinspeed and other experimental conditions and results for each experiment are reported below.

The photoresist is spin-coated on several silicon wafters at a constant, predetermined spin speed ranging from 500 to 1500 rpm. The wafers are then baked at 90° C. for 30-45 minutes to remove the solvent. The initial film thicknesses of coated resist are measured by a Rudolf film Thickness Monitor. Photosensitivity is measured by generating a contrast curve as described (C. G. Willson in "Introduction to Microlithography," Chapter 3, p. 105, American Chemical Society, Washington, D.C. 1983). One plots film thickness loss after one minute development versus the logarithm (ln) of the UV exposure dose. Film thickness is monitored by laser interferometry using the technique described. The resist was then developed using alkaline aqueous developer (AZ Developer, available from American Hoechst Corporation, Somerville, New Jersey) diluted with deionized water, at 25.0±0.5° C. By extrapolation of the plot to total film thickness loss, one obtains the photosensitivity value (mJ/cm$^2$).

The following photosensitizers were used in these experiments and are identified using the following abbreviations:
 (a) Z-2000—a trihydroxybenzophenone—1,2-naphthoquinone diazido-5-sulfonic acid mixed ester.
 (b) TOOL—1,2-naphthoquinone-diazido-5-sulfonic acid tris ester of trihydroxy octanophenone.

EXAMPLE 9

A photoresist solution was prepared by dissolving 13 parts of polyimide of Example 1 of this application and 13 parts by weight of Z-2000 sensitizer in 74 parts of mixed solvent consisting of equal parts of weight of propylene glycol methyl ether and n-methylpyrrolidone. The wafer was spincoated with the resulting solution, dried and exposed to a mercury lamp of 200 watts having wavelength of 365 nm as explained above. The developer concentration was 1 part AZ Developer to 6 parts water. The resist was evaluated using the procedure set forth above and the results were:
 Photosensitivity 97.0mJ/cm$^2$
 Erosion Rate 150°A/min.
 Contrast 1.5

EXAMPLE 10

A photoresist solution was prepared by dissolving 13 parts of polyimide of Example 2 of this application and 13 parts by weight of Z-2000 sensitizer in 74 parts of mixed solvent consisting of equal parts of weight of propylene glycol methyl ether and n-methylpyrrolidone. The wafer was spincoated with the resulting solution, dried and exposed to a mercury lamp of 200 watts having wavelength of 365 nm as explained above. The developer concentration was 1 part AZ Developer to 8 parts water. The resist was evaluated using the procedure set forth above and the results were:
Photosensitivity 82.0 mJ/cm²
Erosion Rate 200°A/min.
Contrast 1.3

EXAMPLE 11

A photoresist solution was prepared by dissolving 13 parts of polyimide of Example 3 of this application and 13 parts by weight of Z-2000 sensitizer in 74 parts of mixed solvent consisting of equal parts of weight of propylene glycol methyl ether and n-methylpyrrolidone. The wafer was spincoated with the resulting solution, dried and exposed to a mercury lamp of 200 watts having wavelength of 365 nm as explained above. The developer concentration was 1 part AZ Developer to 10 parts water. The resist was evaluated using the procedure set forth above and the results were:
Photosensitivity 96.0 mJ/cm²
Erosion Rate 220°A/min.
Contrast 1.42

EXAMPLE 12

A photoresist solution was prepared by dissolving 13 parts of polyimide of Example 4 of this application and 13 parts by weight of Z-2000 sensitizer in 74 parts of mixed solvent consisting of equal parts of weight of propylene glycol methyl ether and n-methylpyrrolidone. The wafer was spincoated with the resulting solution, dried and exposed to a mercury lamp of 200 watts having wavelength of 365 nm as explained above. The developer concentration was 1 part AZ Developer to 2 parts water. The resist was evaluated using the procedure set forth above and the results were:
Photosensitivity 242mJ/cm²
Erosion Rate 160°A/min.
Contrast 1.6

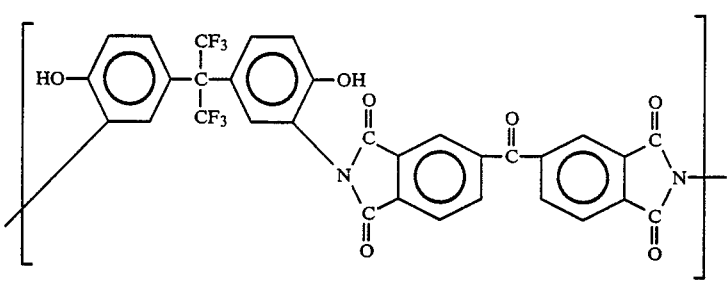

We claim:

1. A hydroxy-substituted polyimide having the recurring unit:

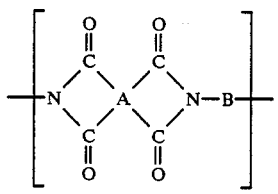

wherein A is a tetravalent moiety containing at least one aromatic ring of six carbon atoms, wherein each of the four carbonyl groups are directly attached to separate carbons in the ring of the moiety A; wherein each pair of carbonyl groups are attached to adjacent carbon atoms in a ring of the moiety A; wherein the moiety B is a divalent radical containing at least one aromatic ring of six carbon atoms and wherein the moiety B contains at least one hydroxy-substituent said polyimide further characterized in that there is present at least one of moiety A comprised of the radical:

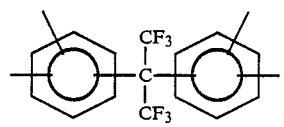

or a moiety B comprised of the radical:

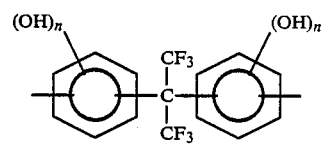

wherein N is an integer independently selected from 0 to

2. A hydroxy-substituted polyimide according to claim 1 wherein the moiety A is a tetravalent radical containing at least two aromatic rings of six carbon atoms.

3. A hydroxy-substituted polyimide according to claim 1 wherein the moiety B is a divalent radical containing at least two aromatic rings of six carbon atoms.

4. A polyimide according to claim 1 wherein the tetravalent aromatic moiety A is selected from the group consisting of substituted and unsubstituted benzene nuceli, naphthalene nuceli, polyphenyl nuceli and mixtures thereof wherein said nuceli are selected from the group consisting of

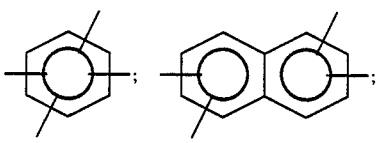

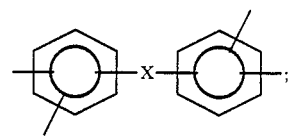

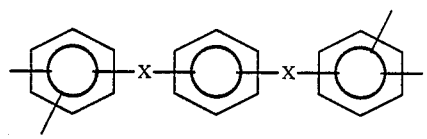

and

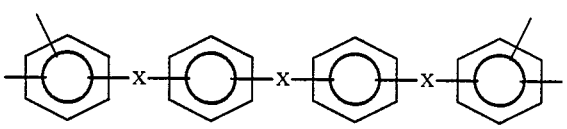

or wherein the moiety B is a hydroxy-substituted divalent radical selected from the group consisting of

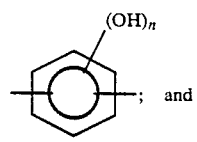

; and

-continued

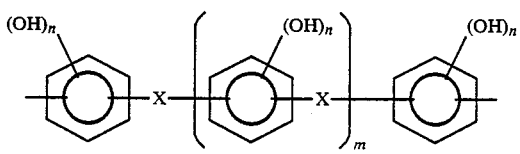

wherein X is a divalent linking group independently selected from the group consisting of a covalent carbon to carbon bond; oxy; carbonyl; sulfonyl; methylene; polymethylene from 2 to 6 carbons; perfluoromethylene; polyperfluoromethylene having 2–6 carbons ; isopropylidene; hexafluoroisopropylidene; and trifluoroisopropylidene; wherein m is an integer from 0 to 4 and wherein n is an integer independently selected from 0 to 3 with the proviso that the divalent moiety B contains at least one hydroxy substituent.

5. A polyimide according to claim 4 wherein the moiety A is selected from the group consisting of

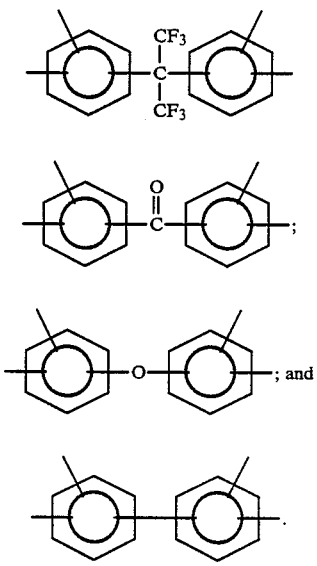

6. A polyimide according to claim 5 where the moiety B comprises

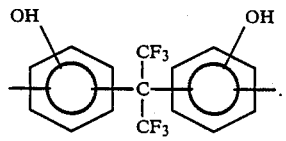

7. The polyimide of claim 1 which is a copolyimide comprising at least about 20 mole percent of recurring units of the formula

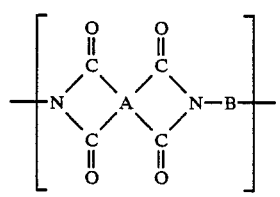

and up to about 80 mole percent of recurring units of the formula:

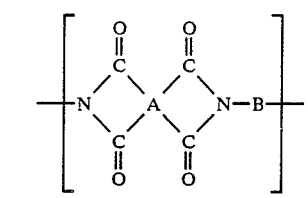

wherein the moiety D is an aromatic divalent radical having at least one six carbon ring having benzenoid unsaturation and further characterized by the absence of hydroxy substituents on said six carbon ring.

8. A copolyimide according to claim 7 wherein the moiety D is present in an amount up to about 50 mole percent of the total number of moles of the moieties B and D.

9. A copolyimide according to claim 7 wherein the moiety D is present in an amount up to about 30 mole percent of the total moles of B and D.

10. A copolyimide according to claim 7 wherein the tetravalent moiety A is selected from the group consisting of substituted and unsubstituted benzene nuceli, naphthalene, nuceli, polyphenyl nuceli and mixture thereof wherein said nuceli are selected from the group consisting of

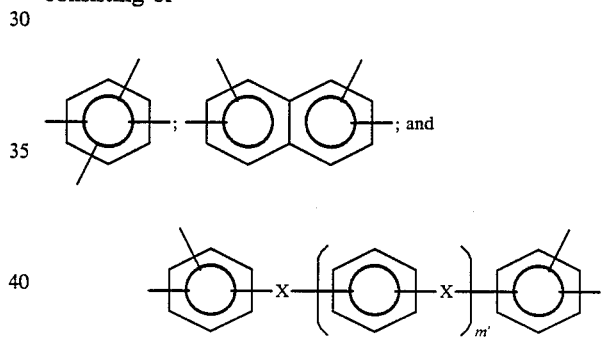

m' is an integer from the group consisting of 0 to 2; wherein the moiety B is a hydroxy substituted divalent radical selected from the group consisting of

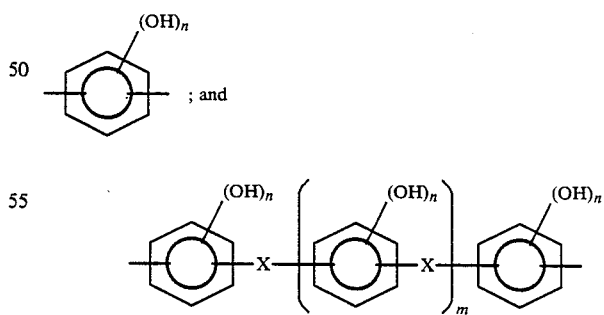

and mixtures thereof;
wherein X is a divalent linking group independently selected from a covalent carbon to carbon bond; oxy; carbonyl; sulfonyl; methylene; polymethylene from 2 to 6 carbons; perfluoromethylene; polyperfluoromethylene having 2–6 carbons ; isopropylidene; hexafluoroisopropylidene; and trifluoroisopropylidene; wherein m is an integer from the group consisting of 0 to 4 and wherein n is an integer independently selected from 0 to 3 with the proviso that the divalent moiety B contains at least one hydroxy substituent; wherein D is a divalent radical selected from the group consisting of

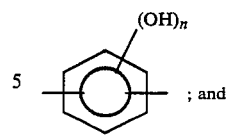
; and

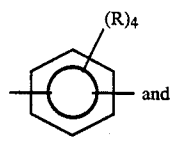 and

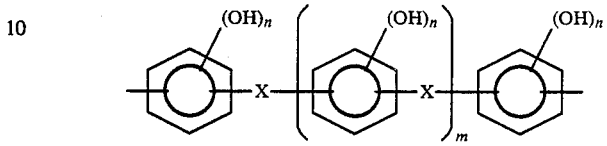

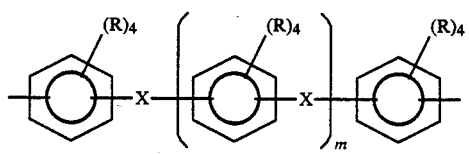

and mixtures thereof;

wherein X is independently selected from the group consisting of a covalent carbon to carbon bond, oxy, carbonyl, sulfonyl, methylene, polymethylene containing 2 to 6 carbons, perfluoromethylene, polyperfluoromethylene containing 2 to 6 carbon atoms, hexafluoroisopropylidene, trifluoroisopropylidene and mixtures thereof.

and mixtures thereof;
wherein m is an integer from 0 to 4; and R is independently selected from lower alkyl of 1 to 6 carbons, lower alkoxy of 1 to 6 carbons, carboxylic acyl having up to 10 carbons, halogen, hydrogen and wherein X is defined above.

11. A copolyimide according to claim 10 wherein the moiety D is present in amount up to about 50 mole percent based upon the number of moles of the moieties B and D.

12. A copolyimide according to claim 10 wherein the moiety D is present in an amount up to about 30 mole percent based upon the number of moles of B and D.

16. A copolyimide according to claim 12 wherein the moiety D is selected from the group consisting of

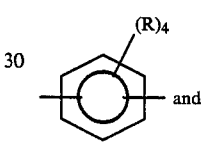 and

13. A copolyimide according to claim 11 wherein the moiety A comprises: the group consisting of

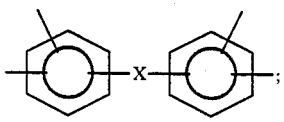

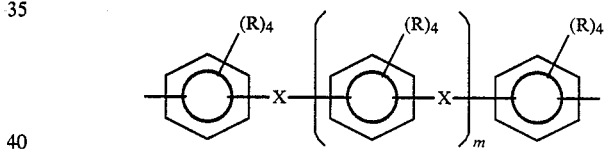

and mixtures thereof;
wherein X is a divalent linking group independently selected from the group consisting of a covalent carbon to carbon bond; oxy; carbonyl; sulfonyl; methylene; polymethylene from 2 to 6 carbons; perfluoromethylene; polyperfluoromethylene having 2-6 carbons; isopropylidene; hexafluoroisopropylidene; and trifluoroisopropylidene; wherein m is an integer from 0 to 4; and R is independently selected from the group consisting of lower alkyl of 1 to 6 carbons, lower alkoxy of 1 to 6 carbons, carboxylic acyl having up to 10 carbons, halogen, and hydrogen.

wherein X is selected from a covalent carbon to carbon bond, oxy, carbonyl, sulfonyl, methylene, polymethylene containing 2 to 6 carbons, perfluoromethylene, polyperfluoromethylene containing 2 to 6 carbon atoms, hexafluoroisopropylidene, trifluoroisopropylidene and mixtures thereof.

14. A copolyimide according to claim 12 wherein the moiety A comprises:

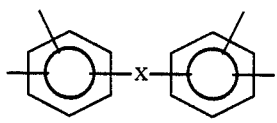

wherein X is selected from the group consisting of a covalent carbon to carbon bond, oxy, carbonyl, sulfonyl, methylene, polymethylene containing 2 to 6 carbons, perfluoromethylene, polyperfluoromethylene containing 2 to 6 carbon atoms, hexafluoroisopropylidene, trifluoroisoropylidene and mixture thereof.

17. A copolyimide according to claim 15 wherein the moiety A comprises:

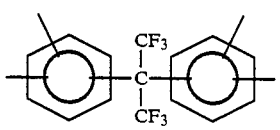

15. A copolyimide according to claim 12 wherein the moiety B is selected from the group consisting of 18. A copolyimide according to claim 15 wherein the moiety B comprises:

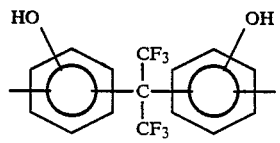

19. A copolyimide according to claim 15 wherein the moiety D comprises:

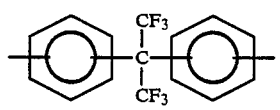

20. A positive working photoresist composition comprising a radiation sensitizer and a polyimide condensation product of at least one aromatic dianhydride and at least one hydroxy substituted aromatic diamine.

21. A positive working photoresist composition according to claim 20 wherein said aromatic dianhydride is selected from the group consisting of hexafluoro-2,2-bis-(dicarboxyphenyl)propane dianhydride; 5,5'-oxybis-1,3-isobenzofurandione; 3,3',4,4'-benzophenone tetracarboxylic dianhydride and 3,3',4,4'-diphenyl tetracarboxylic dianhydride and mixtures thereof.

22. A positive working photoresist composition according to claim 21 wherein said hydroxy substituted aromatic diamine is selected from the group consisting of 3,3'-dihydroxy benzidine; 3,4'-diamino-3'4-dihydroxybiphenyl; 3,3'-dihydroxy-4,4'-diamino diphenyloxide; 3,3'-dihydroxy-4,4'-diamino diphenylsulphone; 2,2-bis-(3-amino-4-hydroxyphenyl)propane; bis-(3-hydroxy-4-aminophenyl)methane; 2,4-diaminophenol; 3,3'-dihydroxy-4,4'-diamino benzophenone; 1,1-bis-(3-hydroxy-4-aminophenyl)ethane; 1,3-bis-(3-hydroxy-4-aminophenyl)propane; 2,2-bis-(3-hydroxy-4-aminophenyl)propane; hexafluoro-2,2-bis-(3-amino-4-hydroxyphenyl)propane and mixtures thereof.

23. A positive working photoresist composition according to claim 22 wherein said hydroxy substituted aromatic diaxine is a hexafluoro 2,2-bis-(hydroxyaminophenyl)propane.

24. A photosensitive article comprising a support substrate having coated thereon a positive working photoresist composition according to claim 20.

25. A photosensitive article comprising a support substrate having coated thereon a positive working photoresist composition according to claim 21.

26. A photosensitive article comprising a support substrate having coated thereon a positive working photoresist composition according to claim 22.

27. A photosensitive article comprising a support substrate having coated thereon a positive working photoresist composition according to claim 23.

28. An article according to claim 24 wherein said substrate is a metallic substrate.

29. An article according to claim 24 wherein substrate is a semiconductor wafer.

30. A protective coating comprising a film of the polyimide of claim 1.

31. The positive working photoresist composition of claim 20 dissolved in a solvent comprising propylene glycol methyl ether.

32. The positive working photoresist composition of claim 20 dissolved in a solvent comprising N-methylpyrrolidone.

33. A method for forming a thermally stable positive photoresist relief pattern which comprises forming a coating of the photosensitive composition of claim 20 on a substrate, imagewise exposing said coating to actinic radiation, and developing the exposed photosensitive composition in an alkaline aqueous developer to remove the exposed area.

34. The polyimide of claim 1 having recurring groups of the structure:

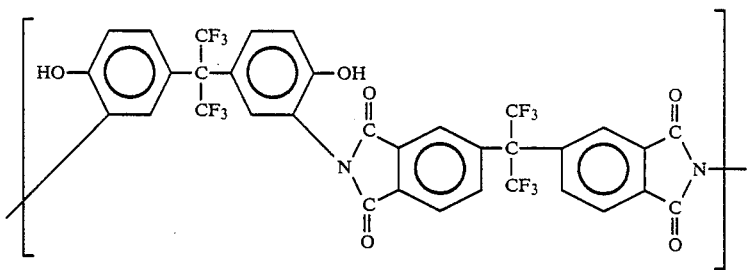

35. The polyimide of claim 1 having recurring groups of the structure:

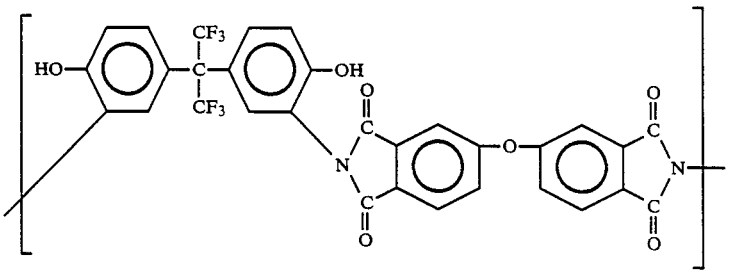

36. The polyimide of claim 1 having recurring groups of the structure: